United States Patent [19]

Muramatsu

[11] Patent Number: 5,670,870
[45] Date of Patent: Sep. 23, 1997

[54] ELECTRIC FIELD SENSOR CAPABLE OF RELIABLY MEASURING AN ELECTRIC FIELD INTENSITY OF A SIGNAL

[75] Inventor: Ryoji Muramatsu, Sendai, Japan

[73] Assignee: Tokin corporation, Miyagi, Japan

[21] Appl. No.: 488,942

[22] Filed: Jun. 9, 1995

[30] Foreign Application Priority Data

Jun. 17, 1994 [JP] Japan ................................. 6-135737

[51] Int. Cl.$^6$ .............................. G01R 31/00; H01J 5/16
[52] U.S. Cl. ........................................................... 324/96
[58] Field of Search ........................... 324/96, 752, 158.1, 324/73.1, 95, 117 R, 244.1, 71.3, 71.1; 343/703, 854; 250/227.11, 227.17, 206.1, 206.2

[56] References Cited

U.S. PATENT DOCUMENTS

| 4,070,621 | 1/1978 | Bassen et al. ............................. 324/96 |
| 5,210,407 | 5/1993 | Ito et al. . |
| 5,389,782 | 2/1995 | Hilliard ..................................... 324/96 |

FOREIGN PATENT DOCUMENTS 2052053  1/1981  United Kingdom.

OTHER PUBLICATIONS

Proceedings of the IEEE., vol. 80, No. 1, Jan., 1992, New York, USA, pp. 209–215, XP000294643, Kanda et al., "Optically Sensed Em–Field Probes for Pulsed Fields".

Review of Scientific Instruments, vol. 63, No. 12, Dec. 1992, New York, USA, pp. 5582–5585, XP000330418, Murooka et al., "Optical High–Sensitive Field Sensor Using a Pockels Crystal".

*Primary Examiner*—Vinh P. Nguyen
*Attorney, Agent, or Firm*—Frishauf, Holtz, Goodman, Langer & Chick

[57] ABSTRACT

An electric field sensor includes an electric field sensor head (13) for varying an intensity of a propagating light beam from a light source (19) in response to an electric field intensity of an input signal received by a reception antenna (11). A photo-electric converter (21) converts the propagating light beam into an output signal. A correcting device (27) compares the output signal with a reference signal to produce and supply a control signal to the photo-electric converter.

4 Claims, 3 Drawing Sheets

ELECTRIC FIELD SENSOR CAPABLE OF RELIABLY MEASURING AN ELECTRIC FIELD INTENSITY OF A SIGNAL

BACKGROUND OF THE INVENTION

This invention relates to an electric field sensor for measuring an electric field intensity of a signal which is an electromagnetic wave propagating through space.

In a manner which will be described later in more detail, a conventional electric field sensor comprises a reception antenna, an electric field sensor head, an incident optical fiber, an outgoing optical fiber, a light source, a photo-electric converter, and a setting device.

The reception antenna is responsive to an input signal. The electric field sensor head varies the light intensity of a propagating light beam propagating therethrough in response to the intensity electric field of the input signal received by the reception antenna. The incident and the outgoing optical fibers are connected to the electric field sensor head. The light source is connected to one end of the incident optical fiber and emits a light beam to the incident optical fiber as the propagating light beam.

The photo-electric converter is supplied with the propagating light beam delivered from the electric field sensor head through the outgoing optical fiber. The photo-electric converter converts the propagating beam into an electric signal as an output signal. The setting device sets the output signal by a first reference signal which has a first reference characteristic. However, the output signal of the photo-electric converter is set by a second reference signal having a second reference characteristic when a measuring temperature changes. The second reference characteristic is different from the first reference characteristic. As a result, the conventional electric field sensor is incapable of reliably measuring the electric field intensity of the input signal.

SUMMARY OF THE INVENTION

It is therefore an object of this invention to provide an electric field sensor which is capable of reliably measuring an electric field intensity of an input signal.

Other objects of this invention will become clear as the description proceeds.

According to this invention, an electric field sensor comprises a reception antenna for receiving an input signal; an electric field sensor head for varying an intensity of a propagating light beam propagating therethrough in response to an electric field intensity of the input signal; an incident optical fiber and an outgoing optical fiber both of which are connected to the electric field sensor head; a light source connected to one end of the incident optical fiber for emitting a light beam to the incident optical fiber as the propagating light beam; a photo-electric converter supplied with the propagating light beam delivered from the electric field sensor head through the outgoing optical fiber for converting the propagating beam into an electric signal as an output signal; and a correcting device supplied with the output signal from the photo-electric converter for comparing the output signal with a reference signal to produce and supply a control signal to the photo-electric converter.

DESCRIPTION OF THE PREFERRED EMBODIMENT

Figure 1:
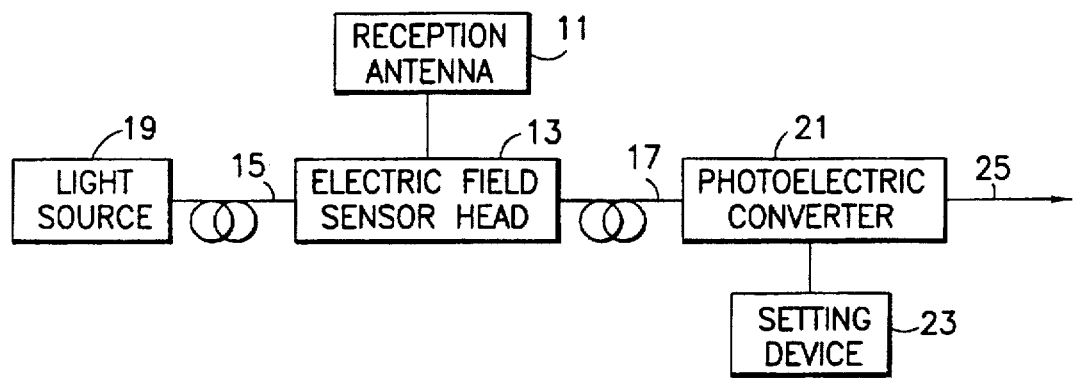
FIG. 1 is a block diagram of a conventional electric field sensor.
Figure 2:
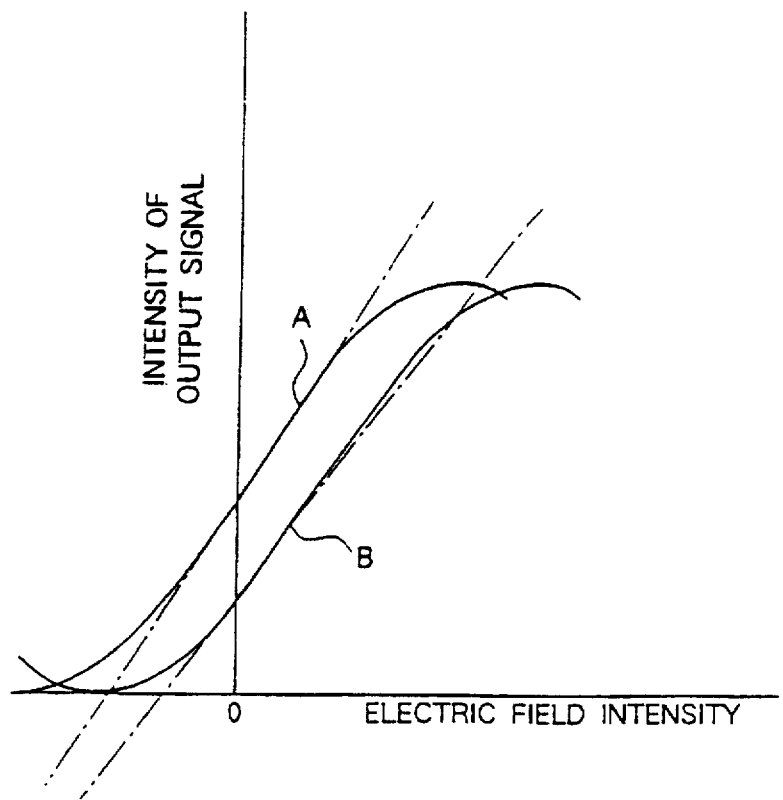
FIG. 2 is a graph illustrating the operation of the conventional electric field sensor illustrated in FIG. 1.

Referring to FIG. 1, a conventional electric field sensor will be described for a better understanding of this invention.

The conventional electric field sensor comprises a reception antenna 11, an electric field sensor head 13, an incident optical fiber 15, an outgoing optical fiber 17, a light source 19, a photo-electric converter 21, and a setting device 23.

The reception antenna 11 is responsive to an input signal. The electric field sensor head 13 varies the light intensity of a propagating light beam propagating therethrough in response to an electric field intensity of the input signal received by the reception antenna 11. The incident and the outgoing optical fibers 15 and 17 are connected to the electric field sensor head 13. The light source 19 is connected to one end of the incident optical fiber 15 and emits a light beam to the incident optical fiber 15 as the propagating light beam.

The photo-electric converter 21 is supplied with the propagating light beam delivered from the electric field sensor head 13 through the outgoing optical fiber 17. The photo-electric converter 21 converts the propagating beam into an electric signal to output an output signal 25 corresponding to the electric signal. The setting device 23 sets the output signal 25 by a first reference signal which has a first reference characteristic.

For example, the first reference characteristic is represented by a first reference characteristic curve A. However, for example, the output signal 25 of the photo-electric converter 21 is set by a second reference signal having a second reference characteristic which is represented by a second reference characteristic curve B when a measuring temperature changes. The second reference characteristic is different from the first reference characteristic. As a result, the conventional electric field sensor is incapable of reliably measuring the electric field intensity of the input signal.

Figure 3:
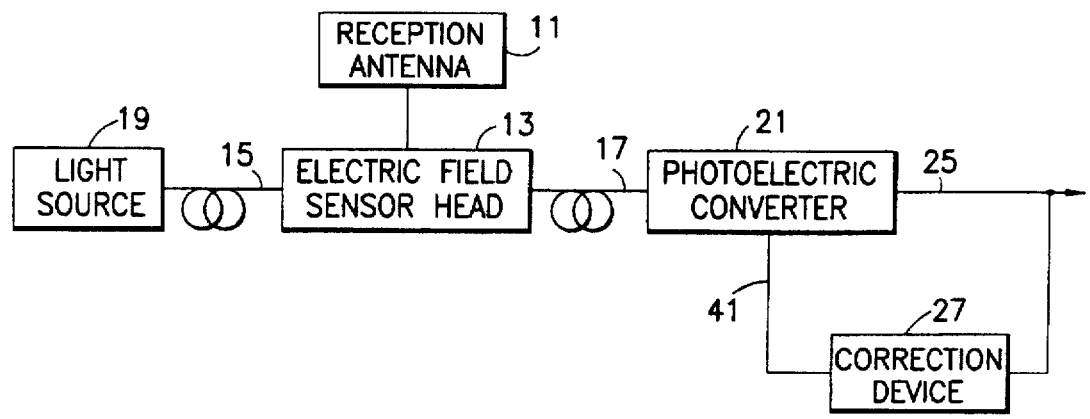
FIG. 3 is a block diagram of the electric field sensor according to an embodiment of this invention.
Figure 4:
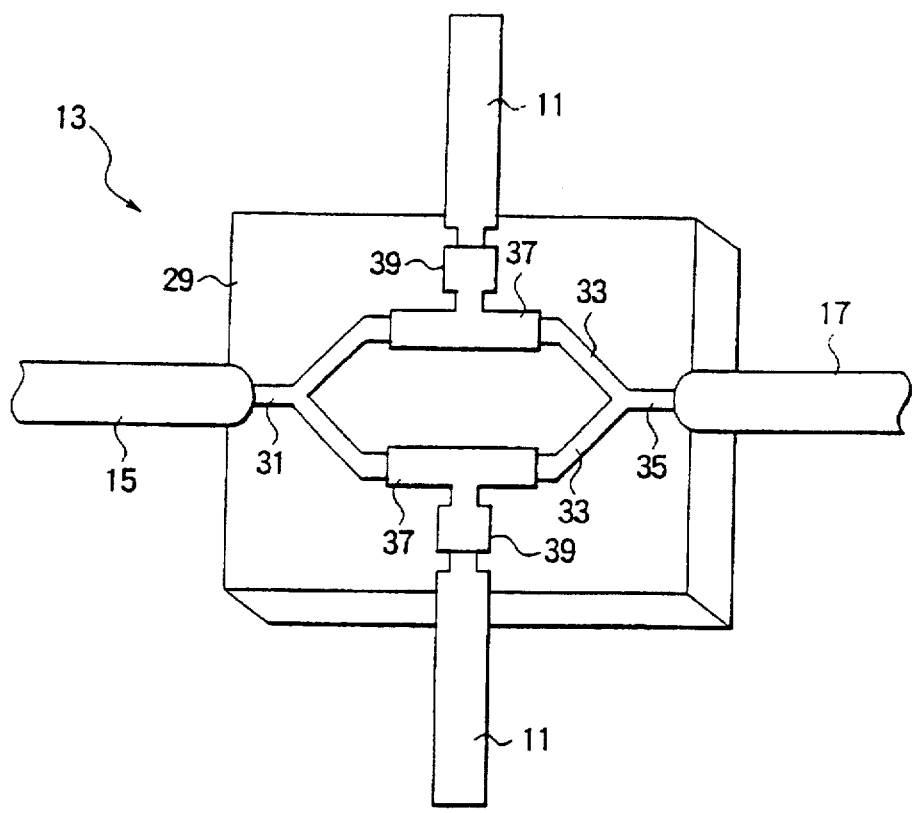
FIG. 4 is a schematic front view of an electric field sensor head of the electric field sensor illustrated in FIG. 3.
Figure 5:
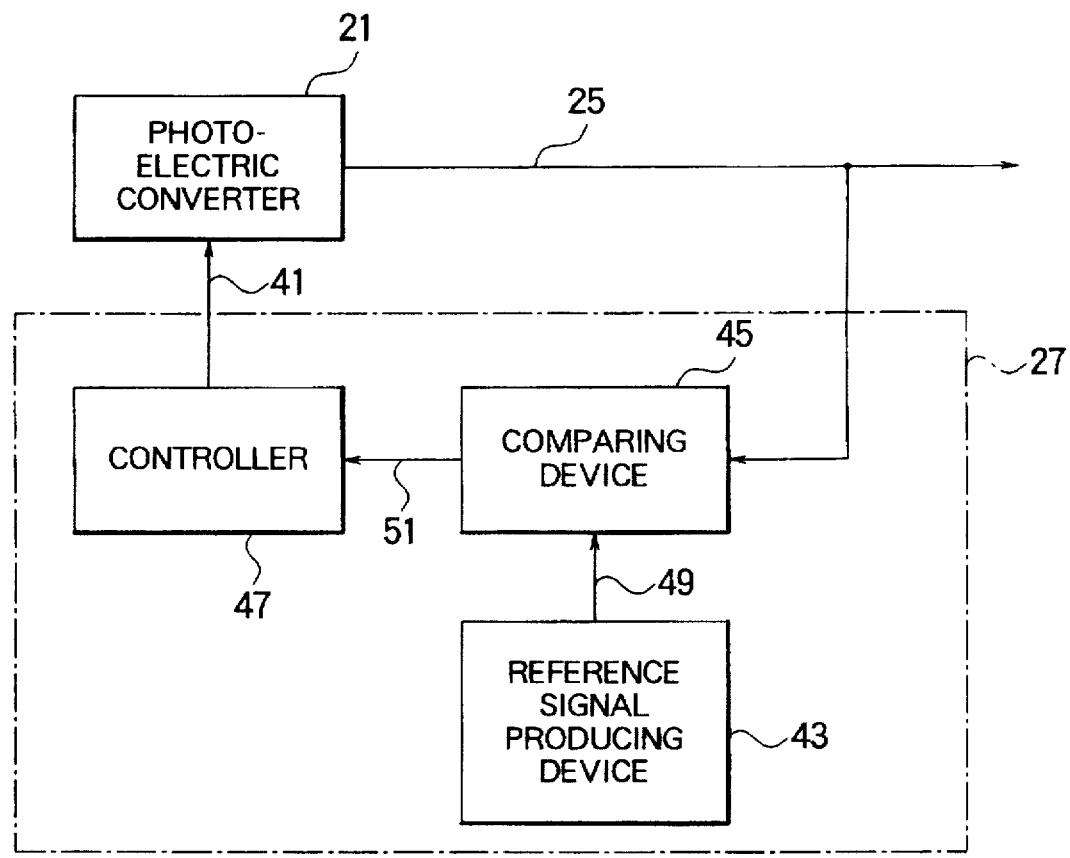
FIG. 5 is a block diagram of a correcting device of the electric field sensor illustrated in FIG. 3.

Referring to FIGS. 3, 4, and 5, the description will continue with an electric field sensor according to an embodiment of this invention. Similar parts are designated by like reference numerals.

In FIG. 3, the electric field sensor comprises the reception antenna 11, the electric field sensor head 13, the incident optical fiber 15, the outgoing optical fiber 17, the light source 19, the photo-electric converter 21, and a correcting device 27. The correcting device 27 is connected to the photo-electric converter 21.

In FIG. 4, the electric field sensor head 13 comprises a substrate 29, an incident optical waveguide 31, two phase-shift optical waveguides 33, an outgoing optical waveguide 35, and modulation electrodes 37. The incident optical waveguide 31 is formed on the substrate 29 to be connected to the incident optical fiber 15. The two phase-shift optical waveguides 33 is formed on the substrate 29 to be branched from the incident optical waveguide 31 and have a variable refractive index which varies in response to the electric field intensity. The outgoing optical waveguide 35 is formed on the substrate 29 to be connected at one end to the outgoing optical fiber 17 and at the other end to the junction of the two phase-shift optical waveguides 33. The modulation electrodes 37 are formed in the vicinity of the two phase-shift optical waveguides 33. Each of the modulation electrodes 37 are connected to the reception antenna 11 through a pad 39 formed on the substrate 29.

An incident light beam is incident an the incident optical fiber 15 and passes through the incident optical waveguide 31 to be provided to the two phase-shift optical waveguides 33. When the reception antenna 11 receives the input signal, electric voltages are induced and applied to the modulation electrodes 37 to produce, in the two phase-shift optical waveguides 33, electric field components having directions opposite to each other in a depth direction.

As a consequence, variation in refractive index is produced in the two phase-shift optical waveguides 33 due to an electrooptical effect so that a phase difference is produced between light beams propagating through the two phase-shift optical waveguides 33. The phase difference has a level dependent upon the electric field intensity applied to the modulation electrodes 37. The light beams are joined and combined in the outgoing optical waveguide 35 as an outgoing light beam having a light intensity which varies due to interference therebetween. In other words, the outgoing light beam emitted to the outgoing optical fiber 17 has an intensity which varies in response to the electric field intensity applied to the modulation electrodes 37.

Referring again to FIG. 3, the correcting device 27 is supplied with the output signal 25 from the photo-electric converter 21. The correcting device 27 compares the output signal 25 with a reference signal 49 to produce and supply a control signal 41 to the photo-electric converter 21. In other words, the correcting device 27 modifies the output signal 25 by comparing the output signal with reference signal 49 in a feedback loop.

In FIG. 5, the correcting device 27 comprises a reference signal producing device 43, a comparing device 45, and a controller 47. The comparing device 45 is connected to the photo-electric converter 21. The comparing device 45 is supplied with the output signal 25 from the photo-electric converter 21. The output signal 25 has an output level when the electric field sensor head 13 is supplied with a reference electric field intensity of the input signal.

The reference signal producing device 43 produces the reference signal 49 which has a reference level. The comparing device 45 is connected to the reference signal producing device 43 and is supplied with the reference signal. The comparing device 45 compares the output level of the output signal 25 with the reference level of the reference signal 49 to produce a deflection signal 51 representing a deflection between the output level and the reference level. The controller 47 is connected to the comparing device 45 and the photo-electric converter 21. The controller 47 is supplied with the deflection signal from the comparing device 45 to produce and supply the control signal 41 to the photo-electric converter 21. The controller 47 is responsive to the deflection signal and controls the photo-electric converter 21 to correct the above-mentioned electric signal when a measuring temperature changes. As a result, the output signal 25 is set by the reference signal even when the measuring temperature changes.

What is claimed is:

1. An electric field sensor comprising:
   a reception antenna for receiving an input signal;
   an electric field sensor head for varying an intensity of a propagating light beam propagating therethrough in response to an electric field intensity of said input signal;
   an incident optical fiber and an outgoing optical fiber both of which are operatively coupled to said electric field sensor head;
   a light source operatively coupled to one end of said incident optical fiber for emitting a light beam to said incident optical fiber as said propagating light beam;
   a photo-electric converter supplied with said propagating light beam delivered from said electric field sensor head through said outgoing optical fiber for converting said propagating light beam into an electric signal, said photo-electric converter outputting an output signal corresponding to said electric signal; and
   a correcting device operatively coupled said photo-electric converter for comparing said output signal with a reference signal to correct said electric signal.

2. An electric field sensor as defined by claim 1, said output signal having an output level when said electric field sensor head is supplied with a reference electric field intensity of said input signal, said correcting device comprising:
   a reference signal producing device for producing said reference signal having a reference level;
   a comparing device operatively coupled to said photo-electric converter and said reference signal producing device for comparing said output level with said reference level to produce a deflection signal; and
   a controller operatively coupled to said comparing device and said photo-electric converter and responsive to said deflection signal from said comparing device for controlling said photo-electric converter to correct said electric signal when an atmosphere of said electric field sensor head changes.

3. An electric field sensor as defined by claim 2, wherein said electric field sensor head comprises:
   a substrate,
   an incident optical waveguide formed on said substrate to be operatively coupled to said incident optical fiber,
   two phase-shift optical waveguides formed on said substrate to be branched from said incident optical waveguide and having a variable refractive index which varies in response to said electric field intensity,
   an outgoing optical waveguide formed on said substrate and operatively coupled at one end to said outgoing optical fiber and at another end to a junction of said two phase-shift optical waveguides, and
   at least one modulation electrode formed in the vicinity of at least one of said two phase-shift optical waveguides.

4. An electric field sensor as defined by claim 1, wherein said electric field sensor head comprises:
   a substrate,
   an incident optical waveguide formed on said substrate to be operatively coupled to said incident optical fiber,
   two phase-shift optical waveguides formed on said substrate to be branched from said incident optical waveguide and having a variable refractive index which varies in response to said electric field intensity,
   an outgoing optical waveguide formed on said substrate and operatively coupled at one end to said outgoing optical fiber and at another end to a junction of said two phase-shift optical waveguides, and
   at least one modulation electrode formed in the vicinity of at least one of said two phase-shift optical waveguides.

* * * * *